United States Patent
Cho et al.

(10) Patent No.: US 7,602,832 B2
(45) Date of Patent: Oct. 13, 2009

(54) SURFACE EMITTING LASER ALIGNED WITH PUMP LASER ON SINGLE HEAT SINK

(75) Inventors: Soo-haeng Cho, Suwon-si (KR); Seong-jin Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 11/442,526

(22) Filed: May 30, 2006

(65) Prior Publication Data
US 2006/0274807 A1    Dec. 7, 2006

(30) Foreign Application Priority Data
Jun. 2, 2005    (KR) .................. 10-2005-0047192

(51) Int. Cl.
*H01S 3/091* (2006.01)
(52) U.S. Cl. .............. 372/70; 372/22; 372/72; 372/75
(58) Field of Classification Search ........... 372/22, 372/70, 72, 75
See application file for complete search history.

(56) References Cited

U.S. PATENT DOCUMENTS

| | | | | |
|---|---|---|---|---|
| 6,097,742 A | * | 8/2000 | Caprara et al. | 372/22 |
| 6,243,407 B1 | * | 6/2001 | Mooradian | 372/92 |
| 6,327,291 B1 | * | 12/2001 | Marshall | 372/75 |
| 2005/0036528 A1 | * | 2/2005 | Schmid | 372/36 |

* cited by examiner

*Primary Examiner*—Minsun Harvey
*Assistant Examiner*—Xnning Niu
(74) *Attorney, Agent, or Firm*—Cantor Colburn LLP

(57) ABSTRACT

A vertical external cavity surface emitting laser is provided that is integrally mounted on a single heat sink together with a pump laser. In the surface emitting laser, a laser chip has a gain structure to emit light at a predetermined wavelength and it is disposed on a center portion of a top surface of a heat sink, an external mirror is spaced apart from the laser chip at a predetermined distance to transmit a portion of the light emitted from the laser chip to an outside and to reflect the remaining portion of the light to the laser chip, a pump laser is disposed on one side of a top surface of the heat sink to emit pump light in a horizontal direction for activating the laser chip, and a reflection mirror is disposed on the other side of the top surface of the heat sink opposite to the pump laser to reflect the pump light emitted from the pump laser to the laser chip.

15 Claims, 5 Drawing Sheets

SURFACE EMITTING LASER ALIGNED WITH PUMP LASER ON SINGLE HEAT SINK

CROSS-REFERENCE TO RELATED PATENT APPLICATION

This application claims the benefit of Korean Patent Application No. 10-2005-0047192, filed on Jun. 2, 2005, in the Korean Intellectual Property Office, the disclosure of which is incorporated herein in its entirety by reference.

BACKGROUND OF THE DISCLOSURE

1. Field of the Disclosure

The present disclosure relates to an optical pumping type vertical external cavity surface emitting laser (VECSEL), and more particularly, to a VECSEL aligned with a pump laser on a single heat sink in one piece.

2. Description of the Related Art

Among semiconductor lasers, an edge emitting laser emits a laser beam in a horizontal direction to a substrate, and a surface emitting laser or vertical cavity surface emitting laser (VCSEL) emits a laser beam in a vertical direction to a substrate. Since the VCSEL oscillates in single longitudinal mode of a very narrow spectrum and emits a beam having a small radiation angle, it has advantages wherein coupling efficiency is high and integration with other devices can be readily achieved. However, a conventional VCSEL makes single transverse mode oscillation difficult in comparison with an edge emitting laser. Further, since single transverse mode operation of the conventional VCSEL requires a small oscillation region, the output is low.

To retain the advantages of the VCSEL while adding high emission power, a vertical external cavity surface emitting laser (VECSEL) has been developed. The VECSEL has an increased gain region by replacing an upper distributed Brag reflector (DBR) with an external mirror so that the VECSEL has a high emission power in the range of several to several tens of watts or more.

FIG. 1 is a schematic sectional view of an optical pumped VECSEL according to the related art. Referring to FIG. 1, a conventional optical pumping type VECSEL includes a laser chip 10 for laser oscillation, a heat sink 20 on which the laser chip 10 is attached through a bonding layer 21, and an external mirror 22 spaced a predetermined distance apart from the laser chip 10. The VECSEL further includes two pump lasers 25 and 26 arranged at both sides at angles to provide pump laser beams to the laser chip 10. The laser chip 10 includes a distributed Bragg reflector (DBR) layer 16, an active layer 18, and an anti-reflection layer 12 that are sequentially stacked on a substrate 14. As known to those of ordinary skill in the art, the active layer 18, for example, has a multi quantum well structure with a resonant periodic gain (RPG) structure and emits light at a predetermined wavelength when activated by a pump laser beam. The heat sink 20 cools the laser chip 10 by dissipating heat generated from the laser chip 10. The pump lasers 25 and 26 emit light at a wavelength shorter than that of the light emitted from the laser chip 10 to the laser chip 10 through lenses 27 and 28 in order to activate the active layer 18 of the laser chip 10.

In this structure, when light emitted from the pump lasers 25 and 26 at a relatively short wavelength is incident on the laser chip 10 through the lenses 27 and 28, the active layer 18 of the laser chip 10 is activated to generate light at a specific wavelength. The light generated from the active layer 18 is repeatedly reflected between the DBR layer 16 of the laser chip 10 and the external mirror 22 through the active layer 18. Therefore, a resonance cavity of the VECSEL is defined between the DBR layer 16 of the laser chip 10 and a concave surface of the external mirror 22. Through this repetition of the reflection, the light is amplified in the laser chip 10, and then a portion of the light is outputted to the outside as a laser beam through the external mirror 22 and the other portion of the light is reflected again to the laser chip 10 as pump light.

However, the conventional VECSEL with the aforementioned structure requires additional heat sinks to cool the pump lasers 25 and 26 besides the heat sink 20 cooling the laser chip 10. Therefore, the laser chip 10 and the pump lasers 25 and 26 cannot be combined into a single module, and this leads to a limitation in reducing the overall size of the VECSEL. Further, an additional process is required to align the laser chip 10 and the pump lasers 25 and 26. Furthermore, in practice, it is difficult to precisely align the laser chip 10 and the pump lasers 25 and 26. As a result, the overall manufacturing process of the VECSEL is complicated and is lengthened. Therefore, it is difficult to mass produce the VECSEL, and the manufacturing cost of the VECSEL increases.

SUMMARY OF THE DISCLOSURE

The present invention may provide a smaller VECSEL in which a pump laser and a laser chip are integrally mounted on the single heat sink such that an additional process for precisely aligning the pump laser is not required and the VECSEL can be mass produced with less cost.

According to an aspect of the present invention, there is provided a surface emitting laser including: a heat sink; a laser chip having a gain structure to emit light at a predetermined wavelength and disposed on a center portion of a top surface of the heat sink; an external mirror spaced apart from the laser chip at a predetermined distance to transmit a portion of the light emitted from the laser chip to outside the surface emitting laser and to reflect the remaining portion of the light to the laser chip; a pump laser disposed on one side of a top surface of the heat sink to emit pump light in a horizontal direction for activating the laser chip; and a reflection mirror disposed on the other side of the top surface of the heat sink opposite to the pump laser to reflect the pump light emitted from the pump laser to the laser chip.

The reflection mirror may be a concave spherical mirror. The distance between the laser chip and the spherical mirror may be less than half the radius of curvature of the spherical mirror. The radius of curvature of the spherical mirror may be in the range of approximately 10 mm to 100 mm.

The surface emitting laser may further include a collimating lens between the pump laser and the reflection mirror to convert the pump light emitted from the pump laser into parallel light. The collimating lens may be attached to a light output surface of the pump laser.

The surface emitting laser may further include an SHG crystal between the laser chip and the external mirror to double the frequency of the light emitted from the laser chip.

The temperature of the pump laser or the laser chip may be controlled by additionally disposing a TEC between the pump laser and the heat sink or between the laser chip and the heat sink.

According to another aspect of the present invention, there is provided a surface emitting laser including: a heat sink defining an opening through a center portion in a vertical direction; a laser chip having a gain structure to emit light at a predetermined wavelength and disposed in the opening of the heat sink; an external mirror spaced apart from a top surface of the heat sink to transmit a portion of the light emitted from the laser chip to outside the surface emitting laser and to reflect the remaining portion of the light to the laser chip; a pump laser disposed on one side of a bottom surface of the heat sink to emit pump light in a horizontal direction for activating of the laser chip; and a reflection mirror disposed on the other side of the bottom surface of the heat sink opposite to the pump laser to reflect the pump light emitted from the pump laser to the laser chip.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

Figure 1:
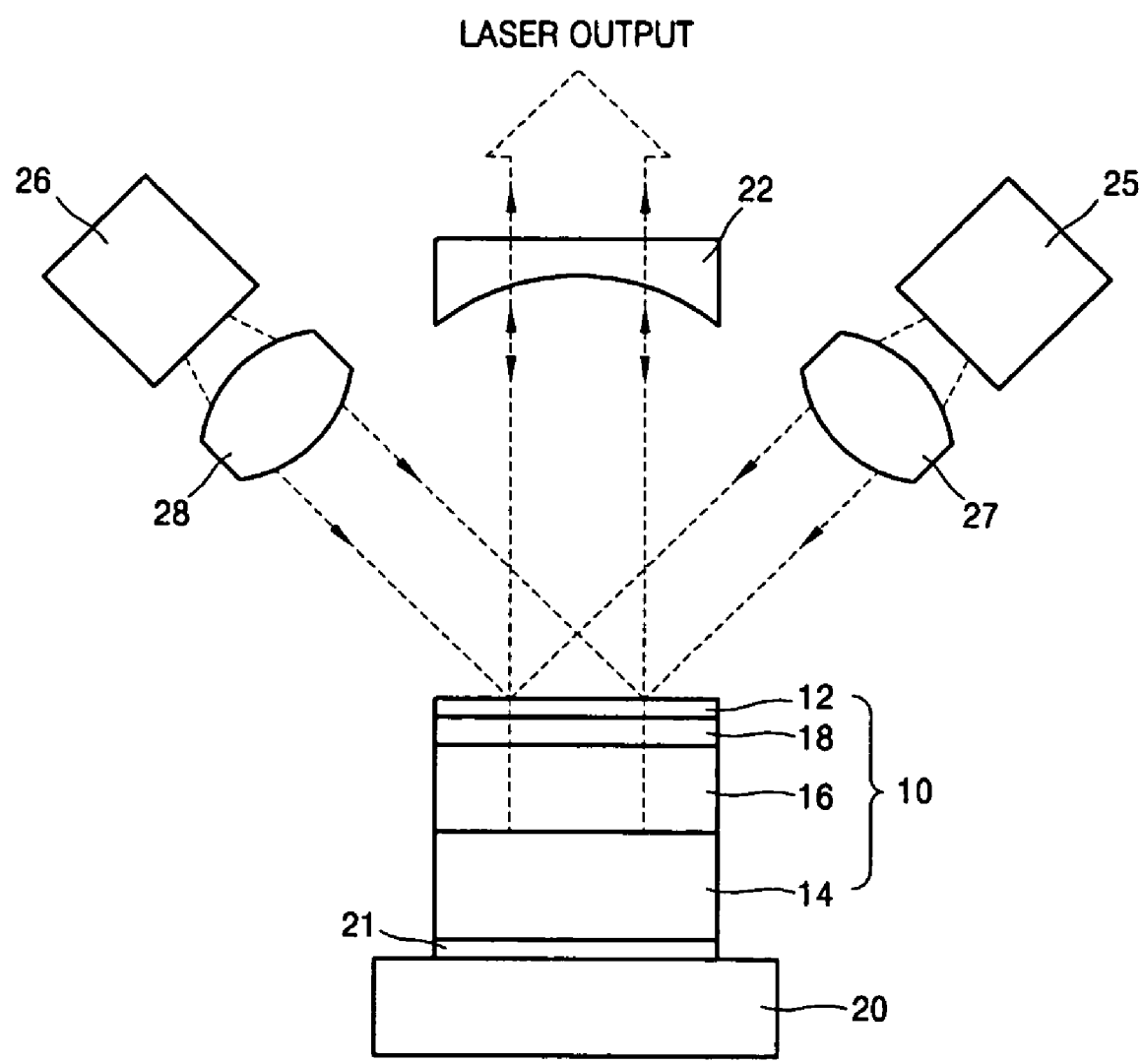
FIG. 1 is a sectional view schematically showing a conventional optical pumping type VECSEL.
Figure 2:
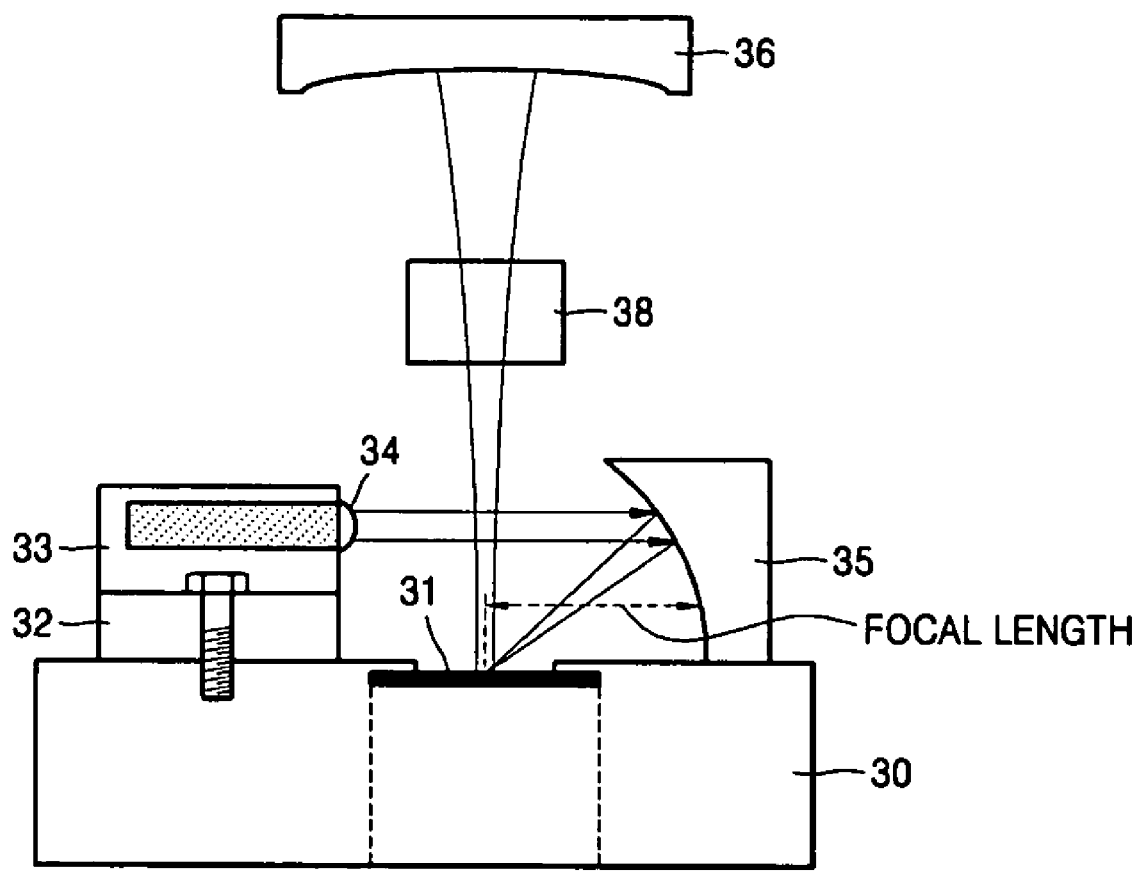
FIG. 2 is a sectional view schematically showing an optical pumping type VECSEL according to a first embodiment of the present invention.

FIG. 2 is a sectional view schematically showing an optical pumping type VECSEL according to a first embodiment of the present invention.

Referring to FIG. 2, the surface emitting laser includes a heat sink 30, a laser chip 31 disposed on a top of the heat sink 30 at a center portion, and a pump laser 33 disposed on a top of the heat sink 30 at a side portion to activate the laser chip 31. Further, the surface emitting laser includes a reflection mirror 35 disposed on a top of the heat sink 30 at the other side portion to reflect pump light emitted from the pump laser 33 to the laser chip 31. Therefore, the pump laser 33 and the reflection mirror 35 confront (oppose) each other on the heat sink 30. Furthermore, the surface emitting laser includes an external mirror 36 spaced apart from the laser chip 31 at a predetermined distance to output a laser beam by transmitting a portion of light emitted from the laser chip 31 and to reflect the other (remaining) portion of the light back to the laser chip 31. Meanwhile, if the laser chip 31 emits, for example, infrared light, the surface emitting laser can further include a second harmonic generation (SHG) crystal 38 between the laser chip 31 and the external mirror 36 to double the frequency of the light emitted from the laser chip 31 (i.e., to reduce the wavelength of the light by half) so as to output a visible laser beam.

The surface emitting laser with the aforementioned structure operates as follows.

First, the pump laser 33 confronting the reflection mirror 35 emits pump laser light at a predetermined wavelength in a horizontal direction. As known to those of ordinary skill in the art, to activate the laser chip 31, the wavelength of the pump light emitted from the pump laser 33 is shorter than that of the light to be emitted from the laser chip 31. For example, if the laser chip 31 emits infrared light, a pump laser emitting light at a wavelength of about 808 nm can be used. Meanwhile, according to an embodiment of the present invention, a collimating lens 34 may be disposed between the pump laser 33 and the reflection mirror 35 to convert the pump laser light emitted from the pump laser 33 into parallel light. Preferably, the collimating lens 34 may be attached to a light exit surface of the pump laser 33.

The parallel light from the collimating lens 34 is reflected by the reflection mirror 35 confronting the pump laser 33 so as to be focused on the laser chip 31. For this, the reflection mirror 35 may be a spherical mirror with a concave reflecting surface. In this case, to maintain an optimized oscillation condition, the laser chip 31 may be located within a focal length of the spherical reflection mirror 35. That is, it is preferable that the horizontal distance between the laser chip 31 and the reflection mirror 35 is less than half the radius of curvature of the reflection mirror 35. The radius of curvature of the reflection mirror 35 is determined depending on the size and output power of the surface emitting laser to be manufactured, and it is generally appropriate that the radius of curvature of the reflection mirror 35 is in the range of approximately 10 mm to 100 mm. Further, the reflecting surface of the reflection mirror 35 may be coated with metal or dielectric material with a high reflectance to reflect most of the pump light emitted from the pump laser 33 to the laser chip 31.

Figure 4:
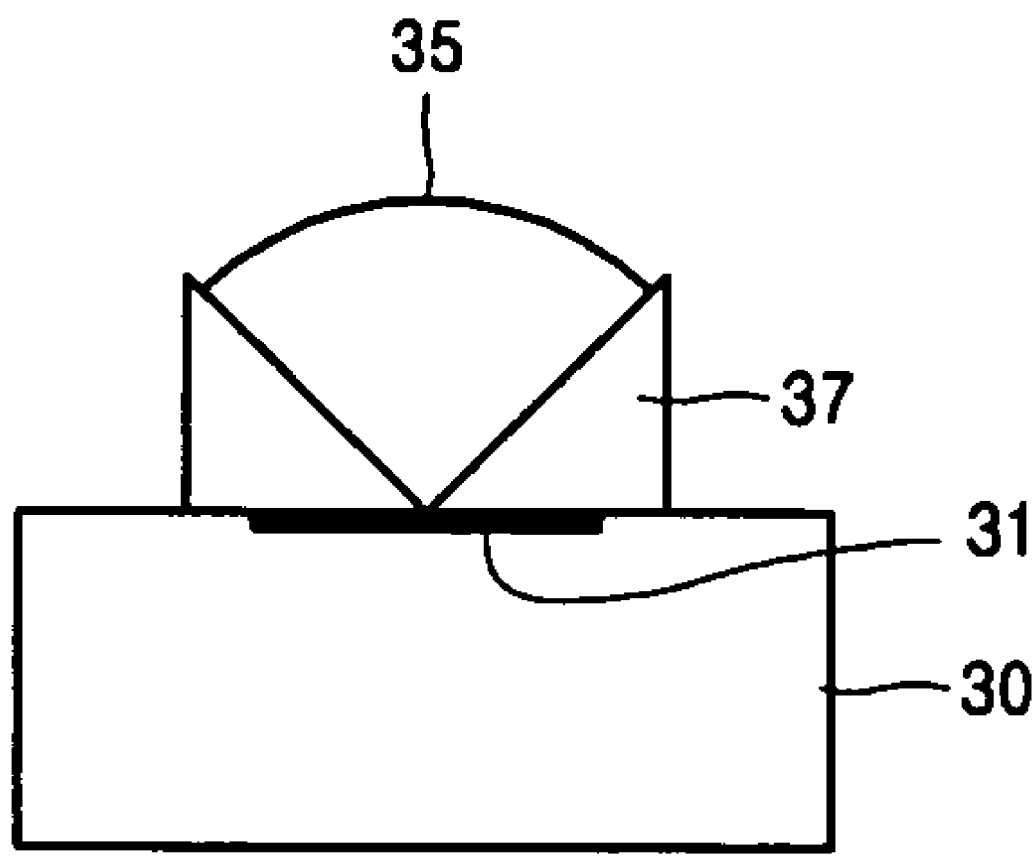
FIG. 4 exemplarily shows a shape of a spherical mirror according to the present invention.

Meanwhile, a spherical mirror can be divided into several parts for being used as the reflection mirror 35, though the entire spherical mirror can be used as the reflection mirror 35. For example, as shown with a front view in FIG. 4, a quarter of a spherical mirror can be fixed to the heat sink 30 using a support 37 to use the quarter for the reflection mirror 35. If the diameter of the pump laser beam is sufficiently small and the size of the reflection mirror 35 is sufficiently large, a mirror piece obtained by dividing a spherical mirror into more pieces can be used. In this case, a number of surface emitting lasers can be manufactured by dividing a single spherical mirror.

When the pump light reflected by the reflection mirror 35 is focused on the laser chip 31, an active layer (not shown) in the laser chip 31 is activated to generate light at a predetermined wavelength. Here, the structure of the laser chip 31 has the same structure as the laser chip used in the conventional VECSEL. That is, as described above, the laser chip 31 includes a DBR layer (not shown) and the active layer (not shown) that are sequentially formed on a substrate (not shown). The active layer, for example, has a gain structure of a multi quantum well structure such as a resonant periodic gain (RPG) structure. The light generated in this manner is amplified while it is repeatedly reflected between the DBR layer in the laser chip 31 and the external mirror 36. A portion of the amplified light is outputted to the outside through the external mirror 36 as a laser beam, and the remaining portion is reflected again to the laser chip 31. If the SHG crystal 38 is placed between the laser chip 31 and the external mirror 36, the wavelength of the laser beam outputted through the external mirror 36 is half the wavelength of the light emitted from laser chip 31. Therefore, if the laser chip 31 emits infrared light, a visible laser beam can be outputted through the external mirror 36.

During the operation, the pump laser 33 and the laser chip 31 generate much heat. In the surface emitting laser of the present invention, as shown in FIG. 2, the heat generated from the pump laser 33 and the laser chip 31 is dissipated to the outside only through the single heat sink 30. A thermo electric cooler (TEC) can be used to increase cooling efficiency for the pump laser 33 and the laser chip 31. That is, as shown in FIG. 2, a TEC 32 can be additionally installed between the pump laser 33 and the heat sink 30. Though the TEC is installed under the pump laser 33 in FIG. 2, another TEC can be installed under the laser chip 31. A TEC is a device that keeps a constant temperature difference between its both sides when a current is applied thereto. After the pump laser 33 is attached to one side of the TEC 32 and the heat sink 30 is attached to the other side of the TEC 32 as shown in FIG. 2, the temperature of the pump laser 33 can be controlled at a constant value by keeping the heat sink 30 at a constant temperature through, for example, water cooling.

As described above, according to the surface emitting laser of the present invention, both the pump laser and the laser chip are mounted on the single heat sink. Therefore, unlike the related art, the pump laser and the laser chip do not require separate heat sinks, respectively, thereby reducing the number of heat sinks required and the overall size of the surface emitting laser. Further, since the pump laser and the laser chip are mounted on the single heat sink at the same time, the pump laser and the laser chip can be simply and easily aligned without requiring an additional process for precisely aligning the pump laser and the laser chip. As a result, the manufacturing process and time can be reduced, thereby allowing mass production with less cost. Particularly, according to the present invention, since the concave spherical mirror is used to focus the pump light on the laser chip instead of using a lens array, optical loss and aberration occurring when light passes a plurality of lenses can be minimized, and also beam blur of the pump light can be minimized.

Figure 5A:
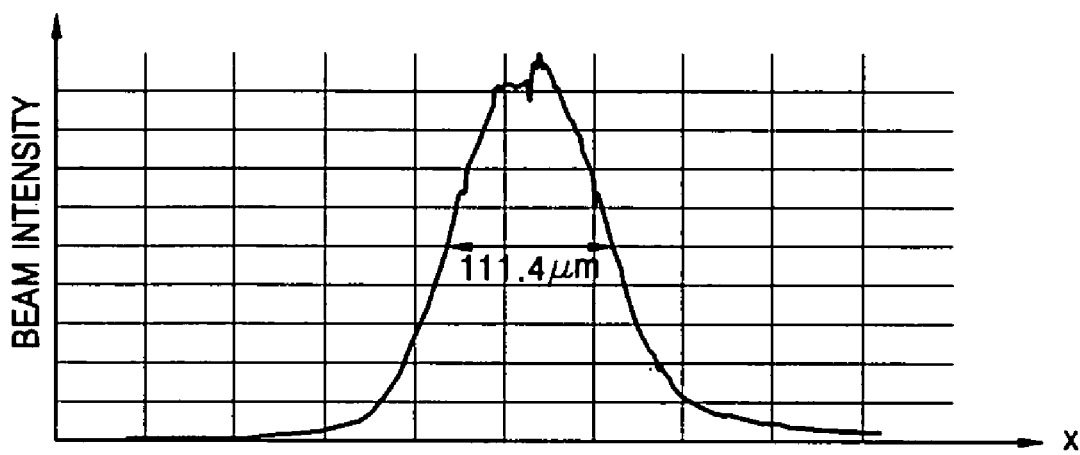
FIGS. 5A and 5B are profile graphs of a pump laser beam emitted from a pump laser toward a laser chip according to the present invention.
Figure 5B:
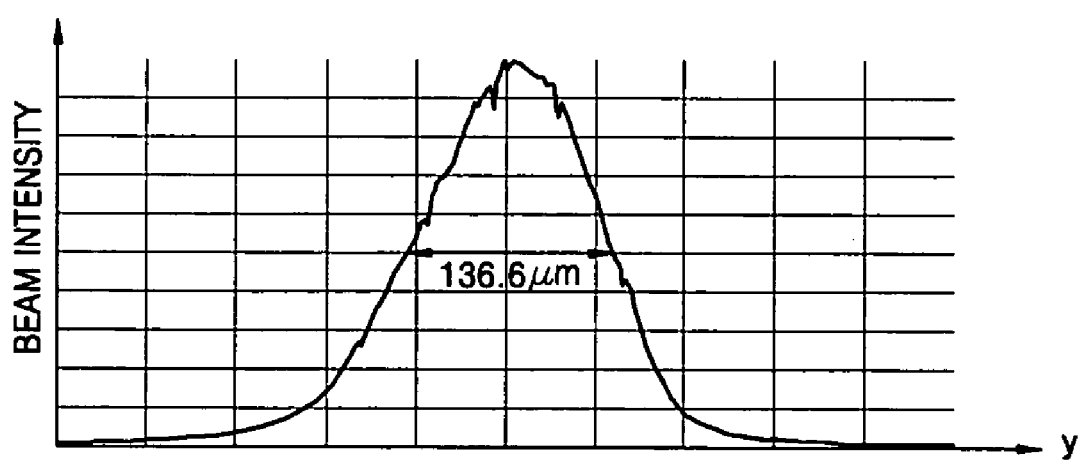

FIGS. 5A and 5B are profile graphs of a pump laser beam emitted from the pump laser 33 to the laser chip 31, FIG. 5A being a section taken along x-axis, FIG. 5B being a section taken along y-axis. Referring to FIGS. 5A and 5B, a full width at half maximum of a pump laser beam reflected by the concave, spherical reflection mirror 35 is approximately 111.4 µm with respect to x-axis and approximately 136.6 µm with respect to y-axis. As shown in FIG. 2, since the pump laser beam is incident on the laser chip 31 at an angle, the pump laser beam on the laser chip 31 has an elliptical shape with different beam diameters along x-axis and y-axis. However, as shown in FIGS. 5A and 5B, the optical distribution along each axis is approximately symmetrical. Further, since general VECSELs require a pump laser beam with a diameter of approximately 50 to 500 µm, the pump laser beam sufficiently meets the diameter constraint of the pump laser beam.

Figure 3:
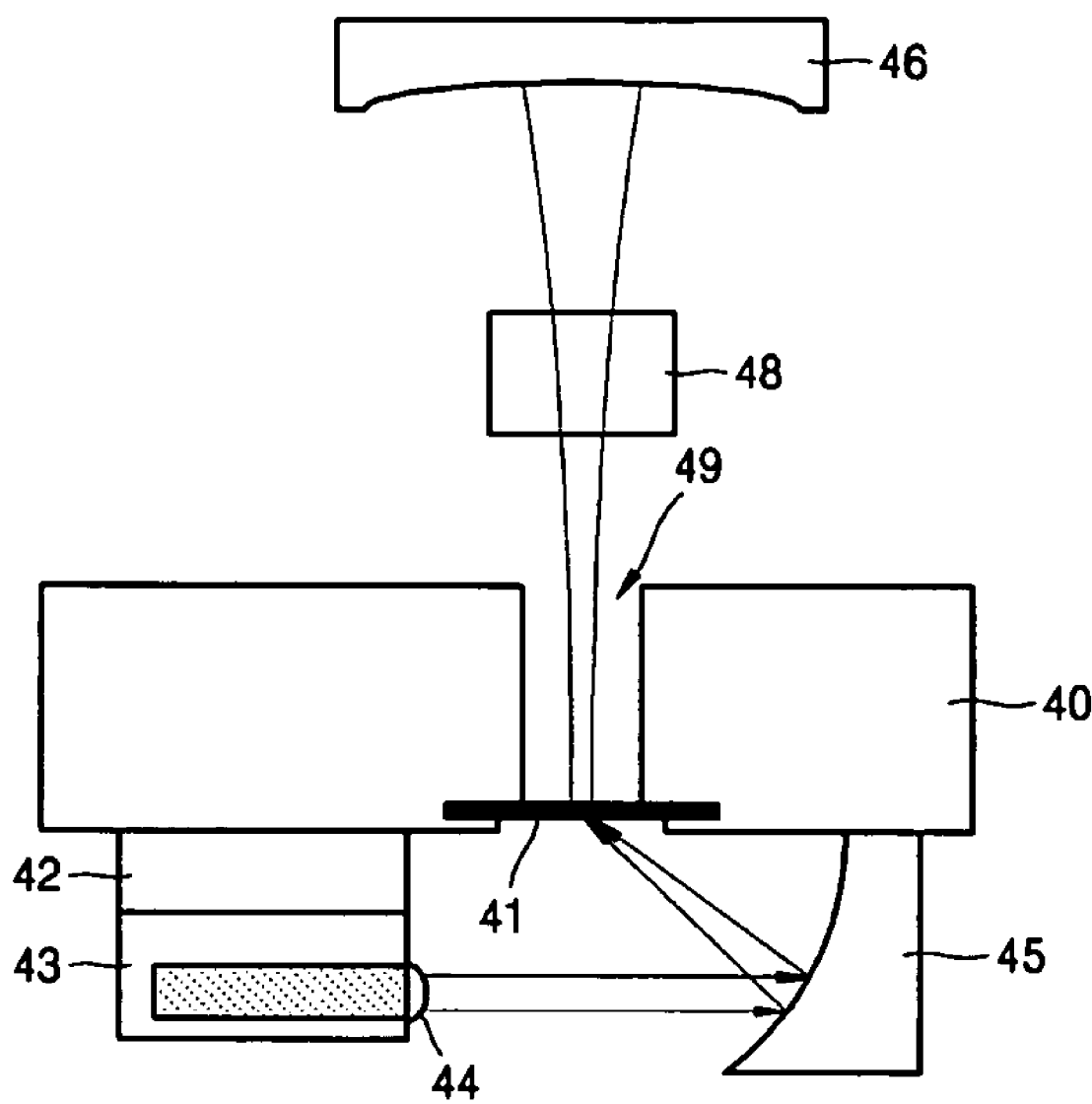
FIG. 3 is a sectional view schematically showing an optical pumping type VECSEL according to a second embodiment of the present invention.

Meanwhile, FIG. 3 is a sectional view schematically showing a VECSEL according to a second embodiment of the present invention. The pumping structure of the VECSEL shown in FIG. 2 is a front-end pumping structure. However, as shown in FIG. 3, a back-end pumping structure can be employed for more efficient laser oscillation. Referring to FIG. 3, the surface emitting laser of the second embodiment of the present invention includes a heat sink 40, and a pump laser 43 and a reflection mirror 45 that confront each other on the heat sink 40. The heat sink 40 defines an opening 49 through a center portion in a vertical direction, and a laser chip 41 is disposed in the opening 49. Though, in FIG. 3, the laser chip 41 is disposed in the opening 49 at a bottom portion of the heat sink 40, the position of the laser chip 41 in the opening 49 can vary depending on the design. Further, similar to the first embodiment, a TEC 42 can be disposed between the pump laser 43 and the heat sink 40. Though not shown, another TEC can be disposed between the laser chip 41 and the heat sink 40.

In this structure, light emitted from the laser chip 41 is incident on an external mirror 46 through the opening 49 and then the light is repeatedly reflected between the external mirror 46 and the laser chip 41. The light is amplified through this repeated reflection and outputted through the external mirror 46 as a laser beam. Generally, an SHG crystal 48 reducing wavelength by half has a wavelength converting efficiency in proportion to the intensity of incident light.

Therefore, it is preferable that the SHG crystal 48 is disposed close to the laser chip 41. Since the back-end pumping type VECSEL shown in FIG. 3 allows the SHG crystal to be disposed closer to the laser chip than the front-end pumping type VECSEL shown in FIG. 2, it can make increased efficiency possible.

As described above, the surface emitting laser of the embodiments of the present invention is designed such that both the pump laser and the laser chip are mounted on the single heat sink. Therefore, unlike the conventional laser device that requires the heat sink for each of the pump laser and the laser chip, the number of heat sinks required can be reduced and the overall size of the surface emitting laser can be reduced. Further, since the pump laser and the laser chip are mounted on the single heat sink at the same time, the pump laser and the laser chip can be simply and easily aligned without requiring an additional process for precisely aligning the pump laser and the laser chip. As a result, the manufacturing process can be simplified, thereby making possible mass production with reduced cost. Particularly, according to the present invention, since the concave spherical mirror is used to focus the pump light on the laser chip instead of using a lens array, optical loss and aberration occurring when light passes a plurality of lenses can be minimized, and also beam blur of the pump light can be minimized.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A surface emitting laser comprising:
   a heat sink;
   a laser chip having a gain structure to emit light at a predetermined wavelength and disposed on a central portion of a top surface of the heat sink;
   an external mirror spaced apart from the laser chip at a predetermined distance to transmit a portion of the light emitted from the laser chip to outside the surface emitting laser and to reflect the remaining portion of the light to the laser chip;
   a pump laser disposed on one side of the top surface of the heat sink to emit pump light in a horizontal direction for activating the laser chip; and
   a reflection mirror disposed on the other side of the top surface of the heat sink opposite to the pump laser to reflect the pump light emitted from the pump laser to the laser chip, wherein:
   the pump laser is configured to emit the pump light in the horizontal direction to bypass the laser chip disposed on the central portion of the top surface of the heat sink;
   the reflection mirror is configured to reflect the pump light bypassing the laser chip toward the laser chip at an angle divergent from the horizontal direction to activate the laser chip; and
   the laser chip is configured to emit the light at the predetermined wavelength in a direction substantially orthogonal to the horizontal direction to the external mirror.

2. The surface emitting laser of claim 1, wherein the reflection mirror is a concave spherical mirror.

3. The surface emitting laser of claim 2, wherein a distance between the laser chip and the spherical mirror is less than half the radius of curvature of the spherical mirror.

4. The surface emitting laser of claim 2, wherein the radius of curvature of the spherical mirror is in the range of approximately 10 mm to 100 mm.

5. The surface emitting laser of claim 1, further comprising a collimating lens between the pump laser and the reflection mirror to convert the pump light emitted from the pump laser into parallel light.

6. The surface emitting laser of claim 5, wherein the collimating lens is attached to a light exit surface of the pump laser.

7. The surface emitting laser of claim 1, further comprising an SHG (second harmonic generation) crystal between the laser chip and the external mirror to double the frequency of the light emitted from the laser chip.

8. The surface emitting laser of claim 1, wherein a temperature of the pump laser or the laser chip is controlled by additionally disposing a TEC (thermo electric cooler) between the pump laser and the heat sink or between the laser chip and the heat sink.

9. A surface emitting laser comprising:
   a heat sink defining an opening through a central portion in a vertical direction;
   a laser chip having a gain structure to emit light at a predetermined wavelength and disposed in the opening of the heat sink;
   an external mirror spaced apart from a top surface of the heat sink to transmit a portion of the light emitted from the laser chip to outside the surface emitting laser and to reflect the remaining portion of the light to the laser chip;
   a pump laser disposed on one side of a bottom surface of the heat sink to emit pump light in a horizontal direction for activating the laser chip; and
   a reflection mirror disposed on the other side of the bottom surface of the heat sink opposite to the pump laser to reflect the pump light emitted from the pump laser to the laser chip, wherein:
   the pump laser is configured to emit the pump light in the horizontal direction to bypass the laser chip disposed in the opening of the heat sink;
   the reflection mirror is configured to reflect the pump light bypassing the laser chip toward the laser chip at an angle divergent from the horizontal direction to activate the laser chip; and
   the laser chip is configured to emit the light at the predetermined wavelength in a direction substantially orthogonal to the horizontal direction to the external mirror.

10. The surface emitting laser of claim 9, wherein the reflection mirror is a concave spherical mirror.

11. The surface emitting laser of claim 10, wherein a distance between the laser chip and the spherical mirror is less than half the radius of curvature of the spherical mirror.

12. The surface emitting laser of claim 9, wherein a collimating lens is attached to a light exit surface of the pump laser to convert the pump light emitted from the pump laser into parallel light.

13. The surface emitting laser of claim 9, further comprising an SHG crystal between the laser chip and the external mirror to double the frequency of the light emitted from the laser chip.

14. The surface emitting laser of claim 9, wherein a temperature of the pump laser or the laser chip is controlled by additionally disposing a TEC between the pump laser and the heat sink or between the laser chip and the heat sink.

15. The surface emitting laser of claim 1, wherein the pump laser and the laser chip are integrally disposed on the heat sink, which is configured to dissipate heat generated by both the pump laser and the laser chip disposed thereon.

* * * * *